US012106992B2

(12) United States Patent
Kobayashi

(10) Patent No.: US 12,106,992 B2
(45) Date of Patent: Oct. 1, 2024

(54) CEILING CARRIER

(71) Applicant: MURATA MACHINERY, LTD., Kyoto (JP)

(72) Inventor: Makoto Kobayashi, Ise (JP)

(73) Assignee: MURATA MACHINERY, LTD., Kyoto (JP)

( * ) Notice: Subject to any disclaimer, the term of this patent is extended or adjusted under 35 U.S.C. 154(b) by 280 days.

(21) Appl. No.: 17/777,404

(22) PCT Filed: Sep. 15, 2020

(86) PCT No.: PCT/JP2020/034895
§ 371 (c)(1),
(2) Date: May 17, 2022

(87) PCT Pub. No.: WO2021/100297
PCT Pub. Date: May 27, 2021

(65) Prior Publication Data
US 2022/0402731 A1    Dec. 22, 2022

(30) Foreign Application Priority Data

Nov. 20, 2019    (JP) ................................ 2019-209950

(51) Int. Cl.
*H01L 21/677*    (2006.01)
*B66C 11/06*    (2006.01)
*B66C 13/08*    (2006.01)

(52) U.S. Cl.
CPC ........ *H01L 21/67733* (2013.01); *B66C 11/06* (2013.01); *B66C 13/085* (2013.01)

(58) Field of Classification Search
CPC ......... B66C 11/04; B66C 11/06; B66C 11/12; B66C 13/08; B66C 13/085; B66C 13/18;
(Continued)

(56) References Cited

U.S. PATENT DOCUMENTS 3,842,986 A * 10/1974 Hupkes ................... B66C 13/06
                                                                294/81.4
5,819,962 A * 10/1998 Okubo ................... B66C 13/06
                                                                 294/81.4
(Continued)

FOREIGN PATENT DOCUMENTS

JP    H10-194410    7/1998
KR    20170061608 A    6/2017
(Continued)

OTHER PUBLICATIONS

Official Communication issued in corresponding Singaporean Patent Application No. 11202205089V, mailed on Apr. 10, 2023.

*Primary Examiner* — Sang K Kim
*Assistant Examiner* — Nathaniel L Adams
(74) *Attorney, Agent, or Firm* — Keating & Bennett, LLP

(57) ABSTRACT

An overhead transport vehicle includes: a winding drum configured to be driven by one driving motor, and to cause a holding unit to be lifted and lowered by winding and paying out a plurality of belts; at least one second idler roller around which the belt paid out from the winding drum is wound; a base provided on a traveling unit, and configured to support the winding drum and the second idler roller; and a linear motion mechanism configured to move a position of the at least one second idler roller so that a connecting portion of the belt to the holding unit moves in a lifting direction.

4 Claims, 14 Drawing Sheets

(58) Field of Classification Search
CPC ......... B66C 13/22; B66C 13/50; B66C 13/06; H01L 21/67733
See application file for complete search history.

(56) References Cited

U.S. PATENT DOCUMENTS

| | | | |
|---|---|---|---|
| 2006/0180565 A1* | 8/2006 | Nakao | B66C 13/06 |
| | | | 212/332 |
| 2017/0152111 A1* | 6/2017 | Kinugawa | H01L 21/67712 |
| 2017/0247190 A1 | 8/2017 | Horii et al. | |
| 2019/0241406 A1 | 8/2019 | Kobayashi | |
| 2020/0010307 A1 | 1/2020 | Gunji | |
| 2020/0270102 A1 | 8/2020 | Wada | |
| 2024/0017973 A1* | 1/2024 | Kobayashi | H01L 21/67733 |

FOREIGN PATENT DOCUMENTS

| | | |
|---|---|---|
| KR | 20170101795 A | 9/2017 |
| KR | 20180133900 A | 12/2018 |
| KR | 20190051055 A | 5/2019 |
| KR | 20200039226 A | 4/2020 |
| WO | 2018/179369 A1 | 10/2018 |

* cited by examiner

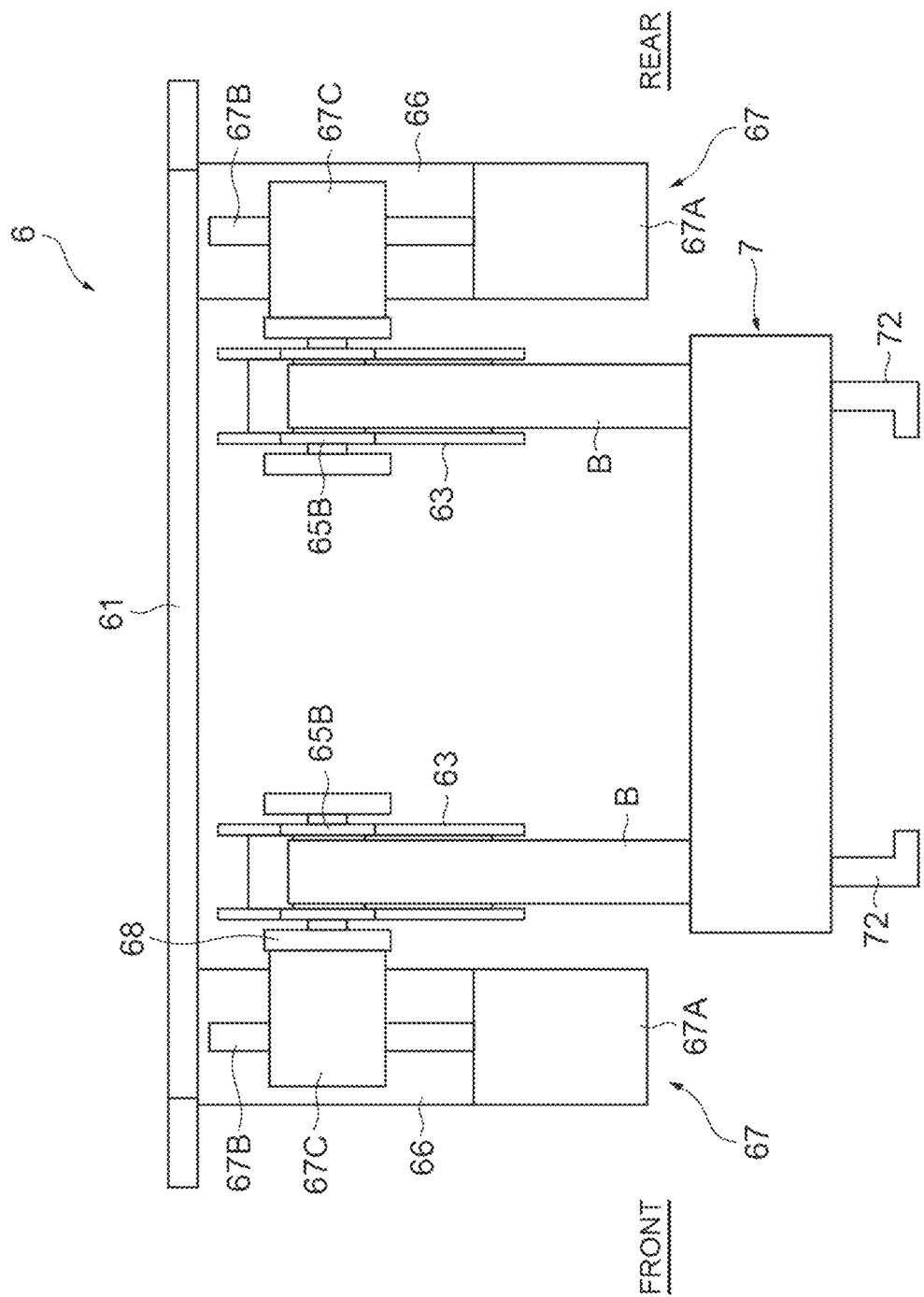

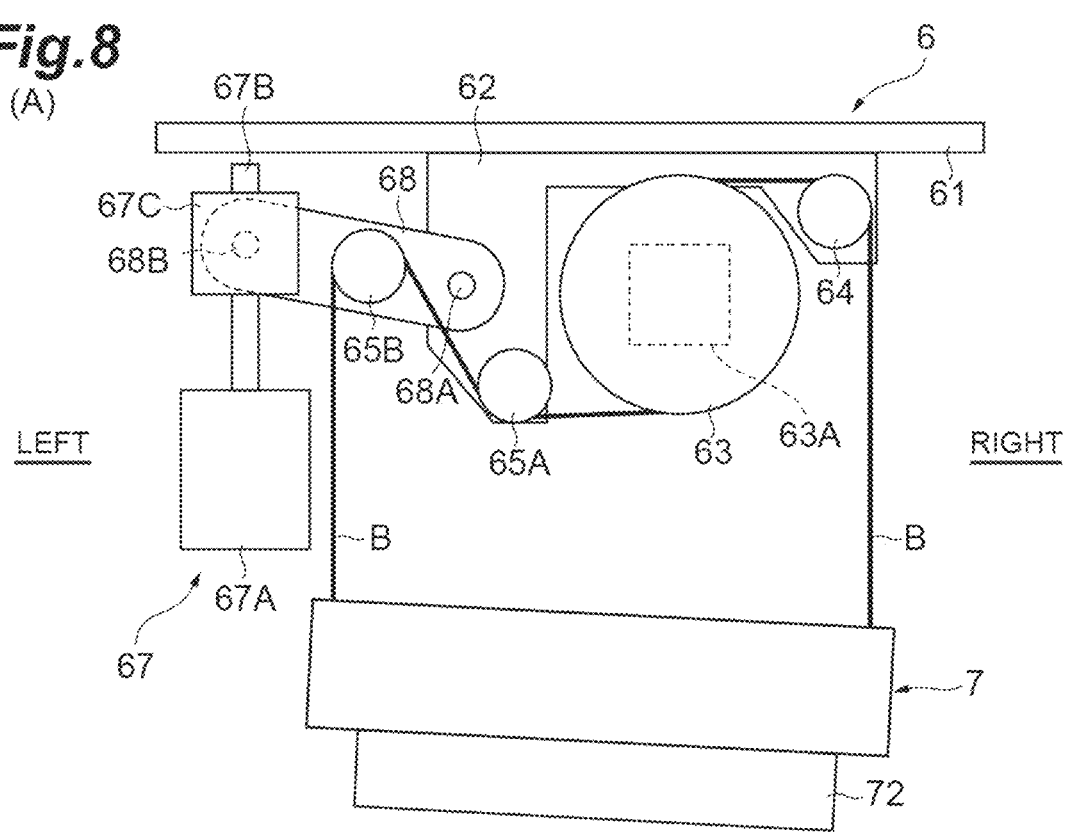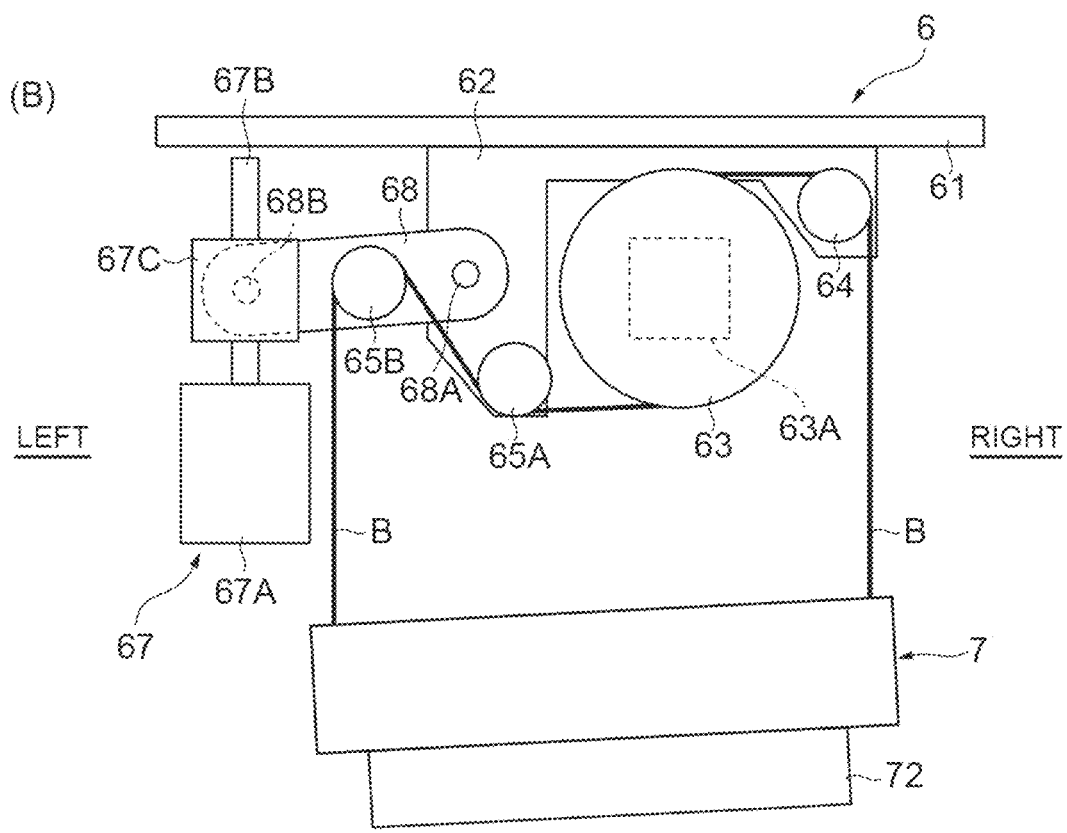

Fig.9
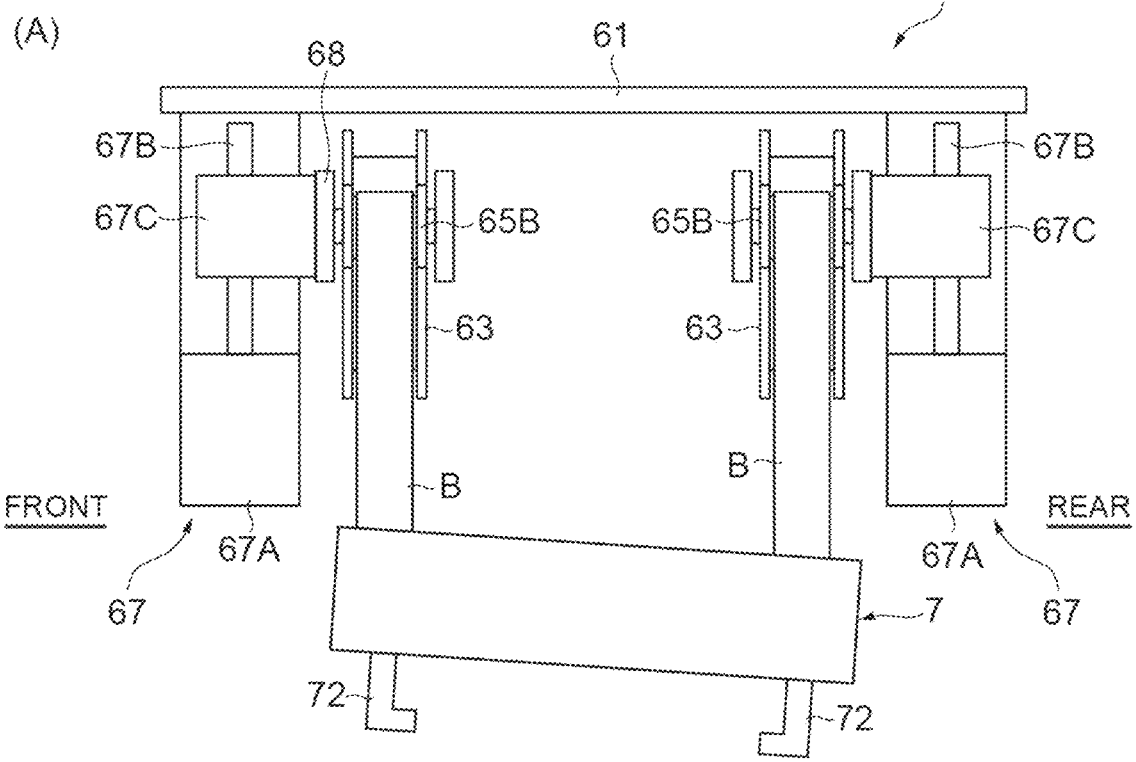
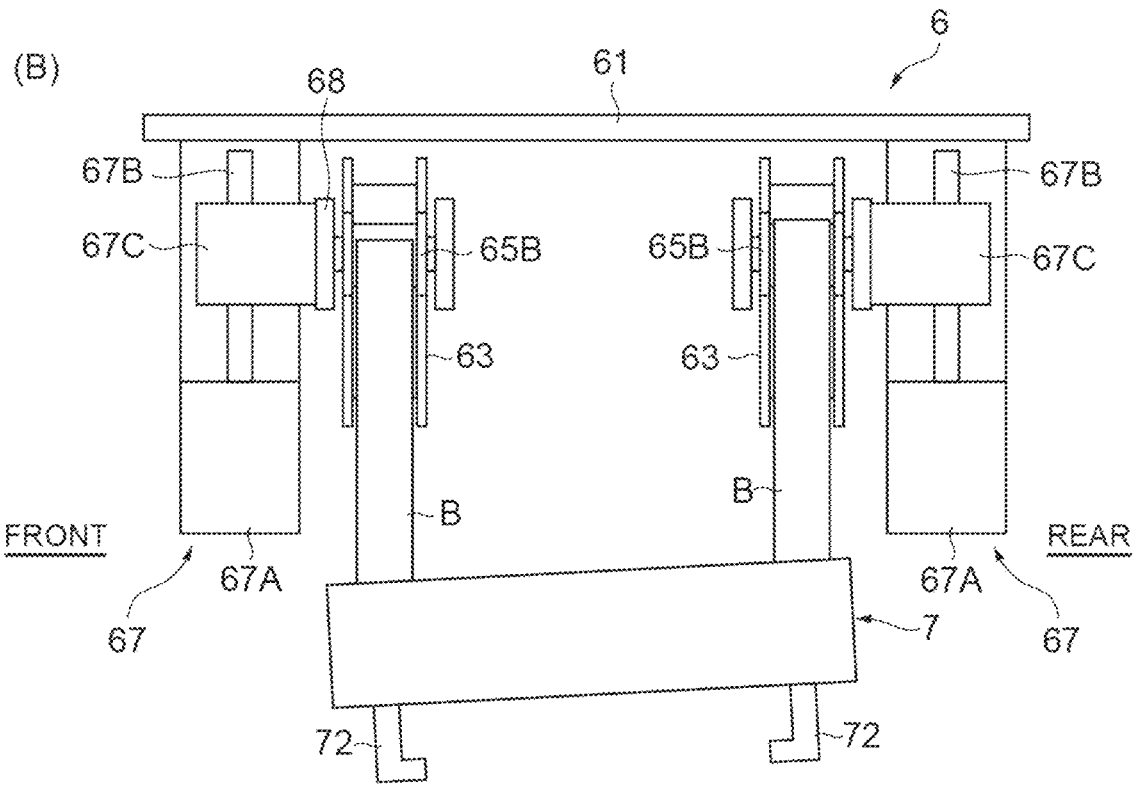

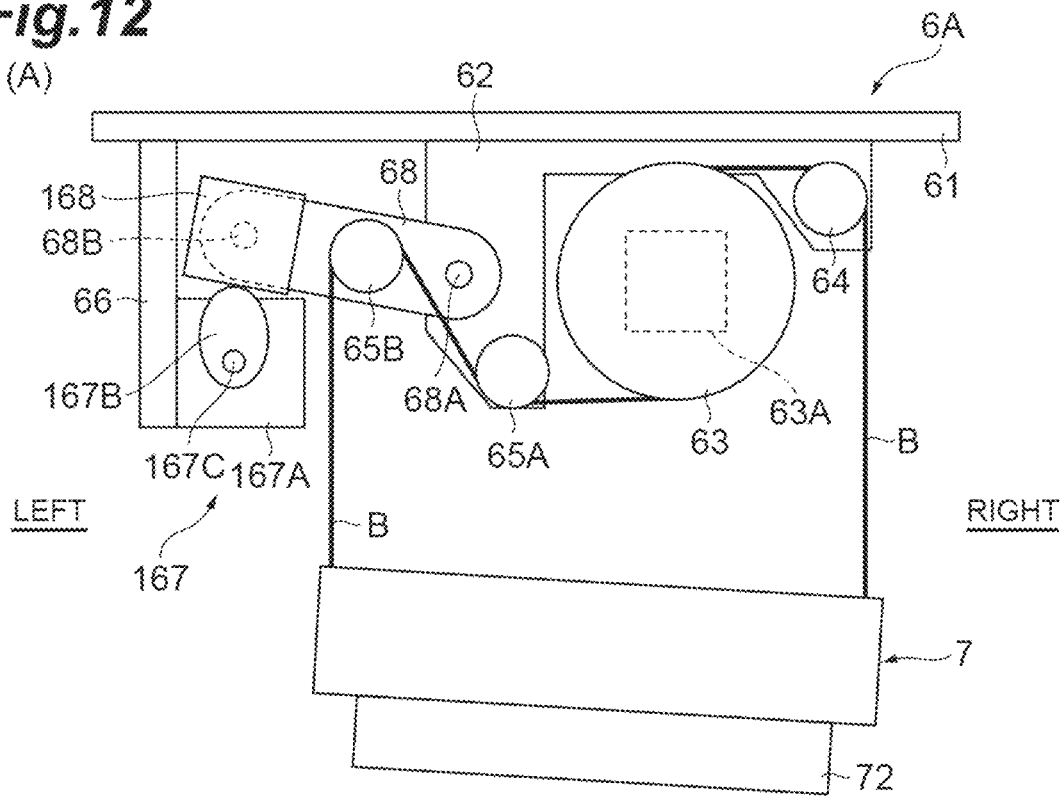
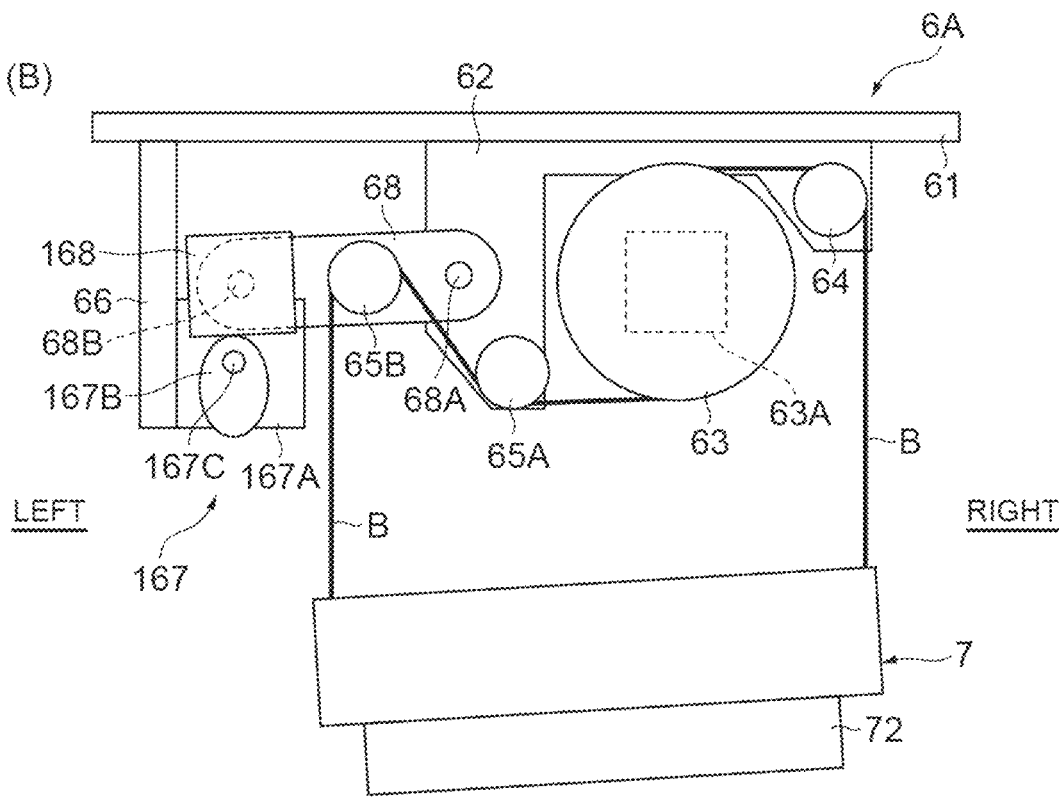
Fig.12

Fig.14
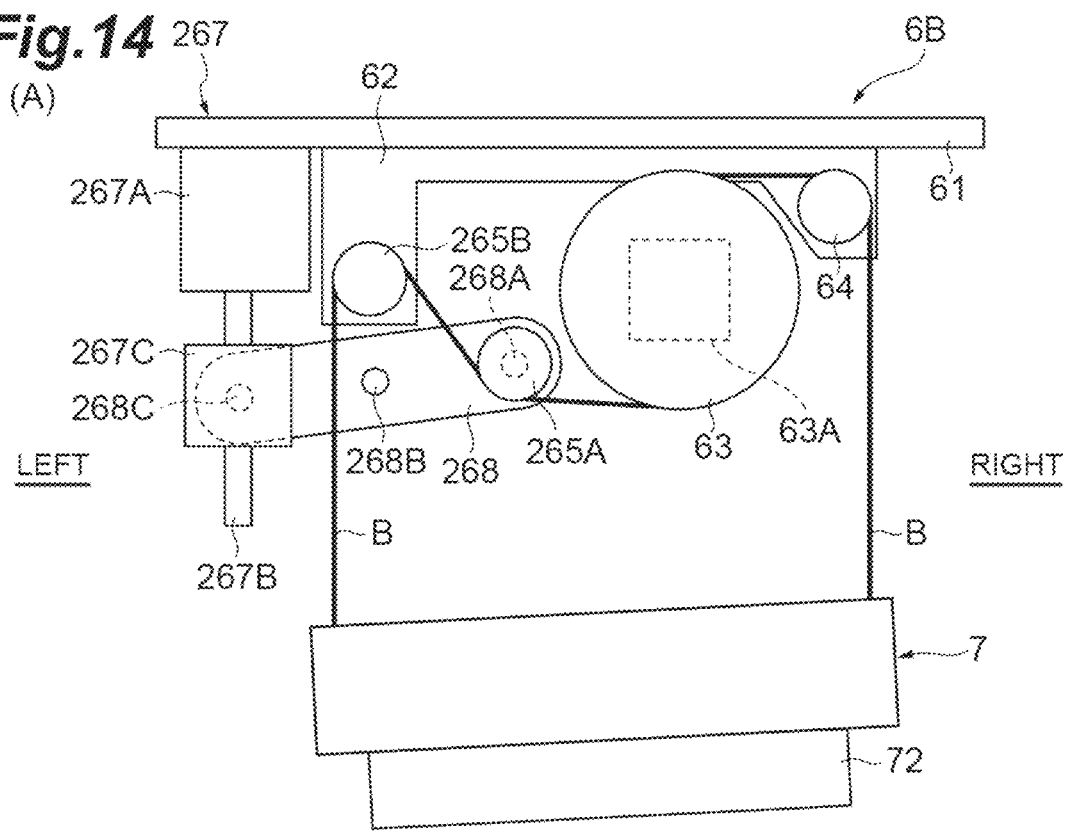
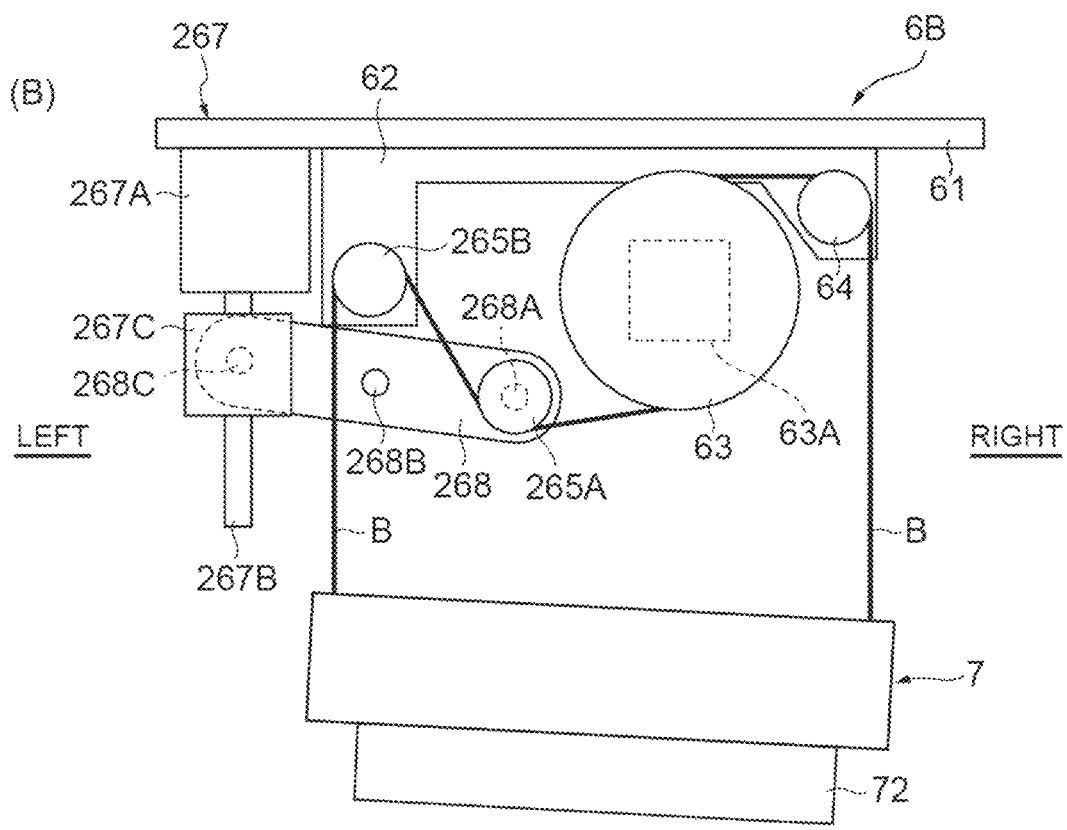

CEILING CARRIER

CROSS-REFERENCE TO RELATED APPLICATIONS

This application is a National Stage Application under 35 U.S.C. § 371 and claims the benefit of International Application No. PCT/JP2020/034895, filed Sep. 15, 2020, which claims priority to JP Provisional Patent Application Serial No. 2019-209950, filed on Nov. 20, 2019, the entire contents of which is incorporated herein by reference.

TECHNICAL FIELD

One aspect of the present invention relates to an overhead transport vehicle.

BACKGROUND ART

There is known an overhead transport vehicle in which a traveling part configured to travel on a track installed on a ceiling and the like and a lifting unit including a gripping part configured to transfer an article to a transfer part such as a shelf or a load port are provided. The lifting unit is suspended and held by a plurality of suspending members such as a belt, and configured to be lifted and lowered by winding or paying out the suspending members. In such an overhead transport vehicle, the lifting unit is required to be maintained in parallel with the transfer part (in a case in which the transfer part is horizontal, the lifting unit is required to be horizontal) during lifting or lowering.

For example, Patent Literature 1 discloses an overhead transport vehicle in which fixed end positions of suspending members with respect to a drum and an unwinding angle of the both suspending members extending from a winding surface of the drum are set so that accumulation of winding differences per rotation of the drum caused by deviation of timing when the two suspending members (lifting belts) that are double wound shift to winding of the next layer is smaller than a predetermined value with which the lifting unit (loading platform) can be held at a required horizontal degree. With this overhead transport vehicle, the winding difference between the two suspending members can be suppressed to fall within a permissible range, and the loading platform can be horizontally held irrespective of a lifting position.

CITATION LIST

Patent Literature

[Patent Literature 1] Japanese Unexamined Patent Publication No. H10-194410

SUMMARY OF INVENTION

Technical Problem

However, an inclination of the lifting unit is caused not only by a winding timing for the next layer of the double-wound suspending members, but also by an error of a thickness of the suspending member or an error of a diameter of a winding drum. That is, the inclination of the lifting unit is also caused by variations in a winding amount such that the winding amount per rotation of the winding drum increases as the winding amount increases. To cope with such variations, thickening amount of winding is adjusted by attaching tape and the like to a winding part to reduce variations in the inclination of the lifting unit. However, such a process is manually performed, so that a burden on an operator is large. Furthermore, such an inclination of the lifting unit may be caused by a machine error of the winding part such as a winding speed of the suspending member and the like. To cope with such various factors, the inclination of the lifting unit is required to be easily adjusted.

An object of one aspect of the present invention is to provide an overhead transport vehicle in which the inclination of the lifting unit can be easily adjusted.

Solution to Problem

An overhead transport vehicle according to one aspect of the present invention is an overhead transport vehicle in which a lifting unit including a gripping part configured to grip an article is configured to be lifted and lowered by a plurality of suspending members with respect to a traveling part traveling along a track, and includes: a winding drum configured to be driven by one winding drive unit and to cause the lifting unit to be lifted and lowered by winding and paying out the suspending members; at least one guide roller around which the suspending member paid out from the winding drum is wound; a body frame provided on the traveling part and configured to support the winding drum and the guide roller; and an actuator configured to move a position of the at least one guide roller so that a connecting portion of the suspending member to the lifting unit moves in a lifting direction.

In the overhead transport vehicle having the configuration described above, the connecting portion of the suspending member to the lifting unit moves when the actuator is caused to operate. Thus, the connecting portion described above can be moved upward or moved downward by performing simple work of causing the actuator to operate. Due to this, the inclination of the lifting unit can be easily adjusted.

In the overhead transport vehicle according to one aspect of the present invention, the suspending members are configured to suspend three points of the lifting unit, and the actuator may move the position of the guide roller around which the suspending members suspending two points of the three points are wound. With this configuration, the lifting unit can be suspended in a stable state. Additionally, by moving the guide roller around which the suspending members suspending the two points are wound, the lifting unit can be caused to be in a desired inclination state.

In the overhead transport vehicle according to one aspect of the present invention, the lifting unit may be suspended by four suspending members via connection members, two of the four suspending members may be connected to one swing part configured to be swingable with respect to the lifting unit, and the remaining two of the four suspending members may be respectively connected to the lifting unit. With this configuration, even in a case in which the lifting unit is suspended by the four suspending members, the lifting unit can be suspended at three points by the two suspending members and the swing member. Due to this, it is possible to reduce the possibility that the lifting unit falls when the suspending member is cut, and the lifting unit can be suspended in a stable state.

The overhead transport vehicle according to one aspect of the present invention may further include a horizontal movement part configured to move the lifting unit in a horizontal direction, and a first control unit configured to control a movement amount of the guide roller moved by the actuator based on a distortion amount of the horizontal movement part at the time when the lifting unit is moved by the horizontal movement part. With this configuration, the actuator is controlled so that the inclination of the lifting unit at the time of transferring the article in the horizontal direction is caused to be in a horizontal state, for example, or substantially the same state as an inclination of the transfer part, based on the distortion amount described above. As a result, the article can be stably delivered from the lifting unit to the transfer part.

The overhead transport vehicle according to one aspect of the present invention may further include an inclination detection unit configured to acquire the inclination of the lifting unit with respect to the horizontal direction, and a second control unit configured to control the actuator so that the inclination acquired by the inclination detection unit becomes a predetermined value. With this configuration, the lifting unit can be caused to be in a desired inclination state (including a horizontal state) at all times.

The overhead transport vehicle according to one aspect of the present invention may further include a storage unit configured to store the inclination of each transfer part which delivers/receives the article to/from the overhead transport vehicle, and a third control unit configured to control the actuator so that the inclination of the lifting unit becomes substantially the same as the inclination of the transfer part on which the article is going to be placed. With this configuration, at the time of delivering the article from the lifting unit to the transfer part, the inclination of the lifting unit can be caused to match the inclination of the transfer part, so that the article can be stably delivered from the lifting unit to the transfer part.

Advantageous Effects of Invention

According to one aspect of the present invention, the inclination of the lifting unit can be easily adjusted.

BRIEF DESCRIPTION OF DRAWINGS

FIG. 7 is a side view of the lifting drive unit.
FIG. 8(A) and FIG. 8(B) are front views illustrating an operation of the lifting drive unit.
FIG. 9(A) and FIG. 9(B) are side views illustrating an operation of the lifting drive unit.
FIG. 12(A) and FIG. 12(B) are front views illustrating an operation of the lifting drive unit according to the first modification.
FIG. 14(A) and FIG. 14(B) are front views illustrating an operation of the lifting drive unit according to the second modification.

DESCRIPTION OF EMBODIMENTS

Figure 1:
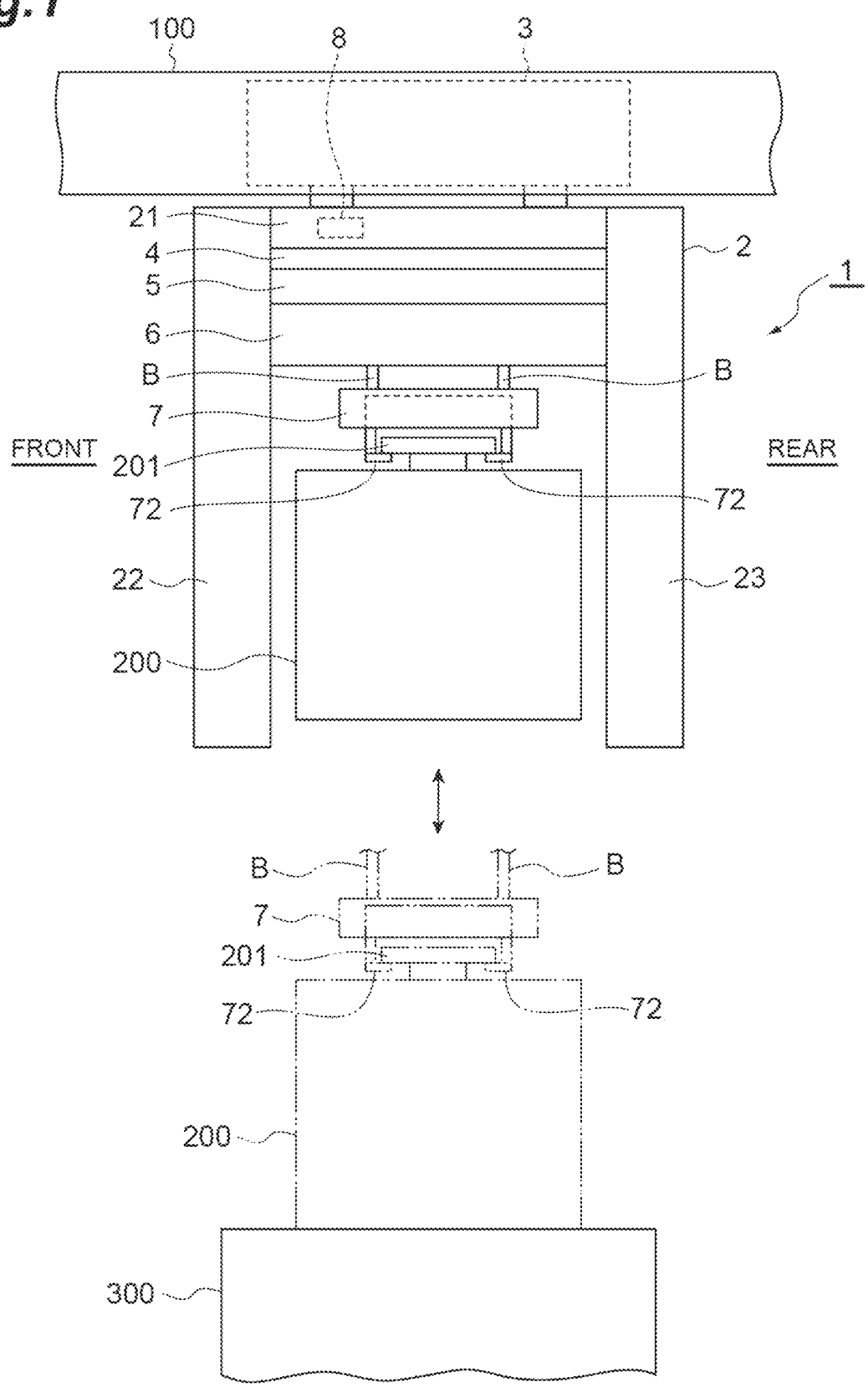
FIG. 1 is a side view of an overhead transport vehicle according to an embodiment.

As illustrated in FIG. 1, an overhead transport vehicle 1 according to an embodiment travels along a track 100 installed in the vicinity of a ceiling of a clean room in which semiconductor devices are manufactured. The overhead transport vehicle 1 according to an embodiment carries a front opening unified pod (FOUP) (article) 200 housing a plurality of semiconductor wafers, and transfers the FOUP 200 to a load port (transfer part) 300 and the like provided on a processing device configured to perform various kinds of processing on the semiconductor wafers.

The overhead transport vehicle 1 includes a frame unit 2, a traveling unit (traveling part) 3, a lateral unit (horizontal movement part) 4, a theta unit 5, a lifting drive unit 6, a holding unit (lifting unit) 7, and a controller 8. The frame unit 2 includes a center frame 21, a front frame 22, and a rear frame 23. The front frame 22 extends downward from an end part on a front side of the center frame 21 (front side in a traveling direction of the overhead transport vehicle 1). The rear frame 23 extends downward from an end part on a rear side of the center frame 21 (rear side in the traveling direction of the overhead transport vehicle 1).

The traveling unit 3 is disposed on an upper side of the center frame 21. For example, the traveling unit 3 travels along the track 100 by receiving electric power supplied from a high-frequency current line installed along the track 100 in a non-contact manner. The lateral unit 4 is disposed on a lower side of the center frame 21. The lateral unit 4 causes the theta unit 5, the lifting drive unit 6, and the holding unit 7 to move in a lateral direction (a lateral side in the traveling direction of the overhead transport vehicle 1). The theta unit 5 is disposed on a lower side of the lateral unit 4. The theta unit 5 turns the lifting drive unit 6 and the holding unit 7 in a horizontal plane.

The lifting drive unit 6 is disposed on a lower side of the theta unit 5. The lifting drive unit 6 causes the holding unit 7 to be lifted and lowered. The holding unit 7 is disposed on a lower side of the lifting drive unit 6. The holding unit 7 holds a flange part 201 of the FOUP 200. The controller 8 is disposed in the center frame 21. The controller 8 is an electronic control unit constituted of a CPU, a ROM, a RAM, and the like. The controller 8 controls respective parts of the overhead transport vehicle 1.

By way of example, the overhead transport vehicle 1 configured as described above operates as follows. In a case of transferring the FOUP 200 to the overhead transport vehicle 1 from the load port 300, the overhead transport vehicle 1 not holding the FOUP 200 stops above the load port 300. In a case in which a horizontal position of the holding unit 7 deviates from a position right above the load port 300, the lateral unit 4 and the theta unit 5 are driven to finely adjust the horizontal position and an angle of the holding unit including the lifting drive unit 6. Subsequently, the lifting drive unit 6 lowers the holding unit 7, and the holding unit 7 holds the flange part 201 of the FOUP 200 placed on the load port 300. Subsequently, the lifting drive unit 6 lifts the holding unit 7 up to an lifting end, and disposes the FOUP 200 between the front frame 22 and the rear frame 23. Subsequently, the overhead transport vehicle 1 holding the FOUP 200 starts to travel.

On the other hand, in a case of transferring the FOUP 200 from the overhead transport vehicle 1 to the load port 300, the overhead transport vehicle 1 holding the FOUP 200 stops above the load port 300. In a case in which the horizontal position of the holding unit 7 (FOUP 200) deviates from the position right above the load port 300, the lateral unit 4 and the theta unit 5 are driven to finely adjust the horizontal position and the angle of the holding unit including the lifting drive unit 6. Subsequently, the lifting drive unit 6 lowers the holding unit 7, the FOUP 200 is placed on the load port 300, and the holding unit 7 releases the flange part 201 of the FOUP 200. Subsequently, the lifting drive unit 6 lifts the holding unit 7 up to the lifting end. Subsequently, the overhead transport vehicle 1 not holding the FOUP 200 starts to travel.

Figure 2:
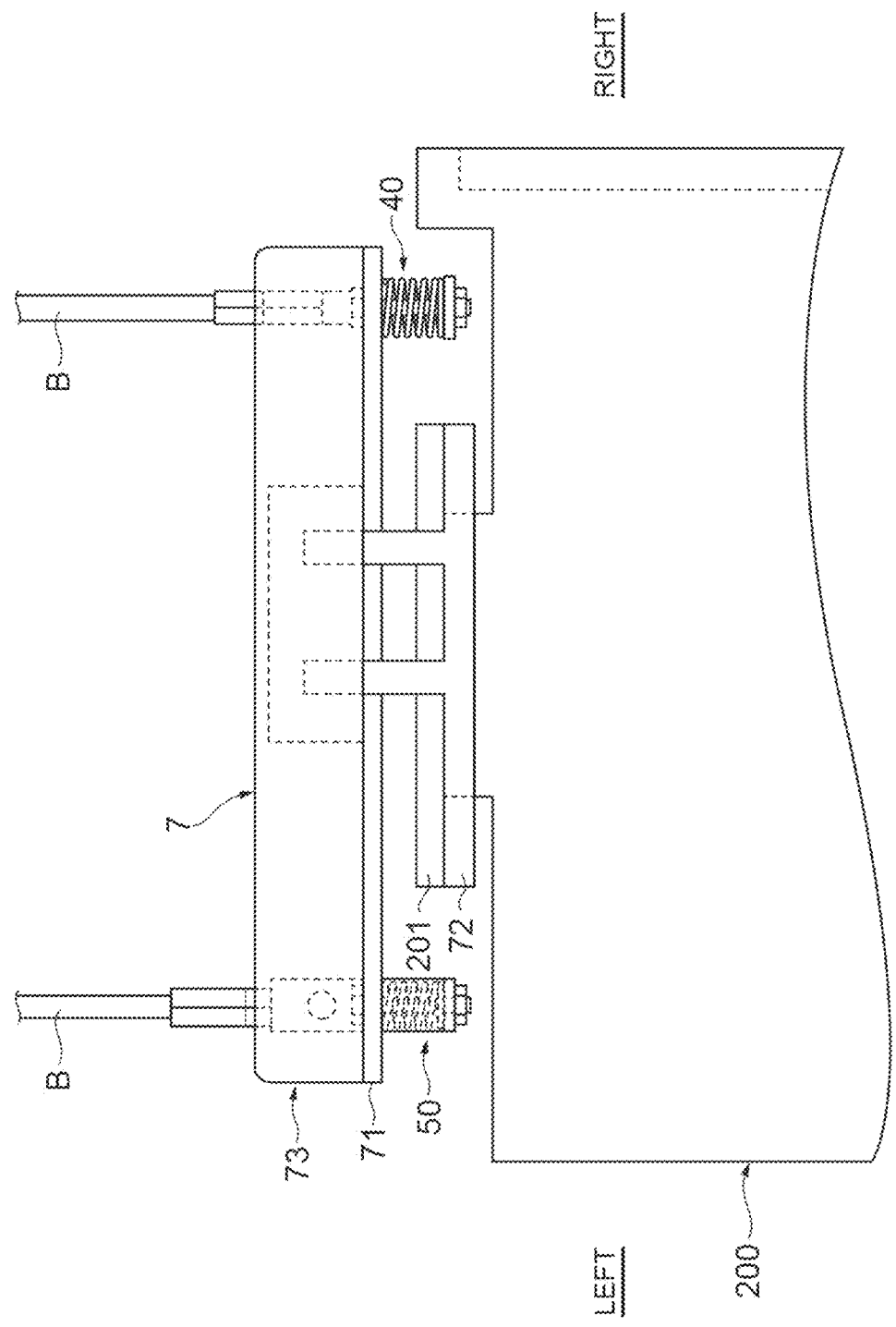
FIG. 2 is a front view of a holding unit.

Next, the following describes a configuration of the holding unit 7 in detail. As illustrated in FIG. 1 and FIG. 2, the holding unit 7 includes a base 71, a pair of grippers (gripping parts) 72, and a housing 73. The pair of grippers 72 is supported by the base 71 to be able to be opened or closed along the horizontal direction. The pair of grippers 72 is opened or closed by a driving motor (not illustrated) and a link mechanism (not illustrated). In the present embodiment, a height position of the holding unit 7 is adjusted so that holding surfaces of the grippers 72 become lower than a height of a lower surface of the flange part 201 when the pair of grippers 72, 72 is in an opened state. In this state, when the pair of grippers 72, 72 is caused to be in a closed state, the holding surfaces of the grippers 72 get under the lower surface of the flange part 201, and the lifting drive unit 6 is lifted in this state. Accordingly, the flange part 201 is held (gripped) by the pair of grippers 72, 72, and the FOUP 200 is supported. In the holding unit 7, the base 71 constitutes a bottom wall of the housing 73, and a position thereof with respect to the housing 73 is fixed.

Figure 3:
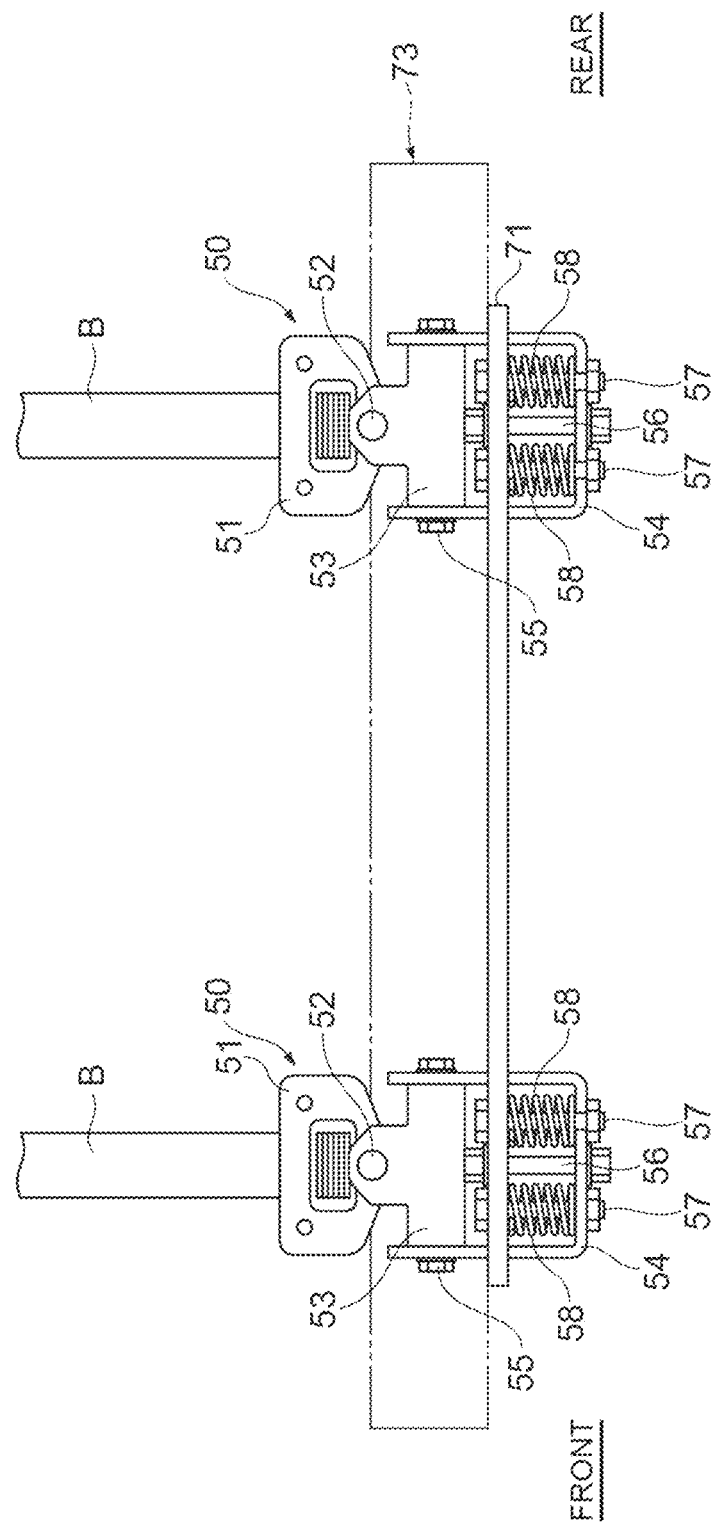
FIG. 3 is a side view of a first buffering mechanism.
Figure 4:
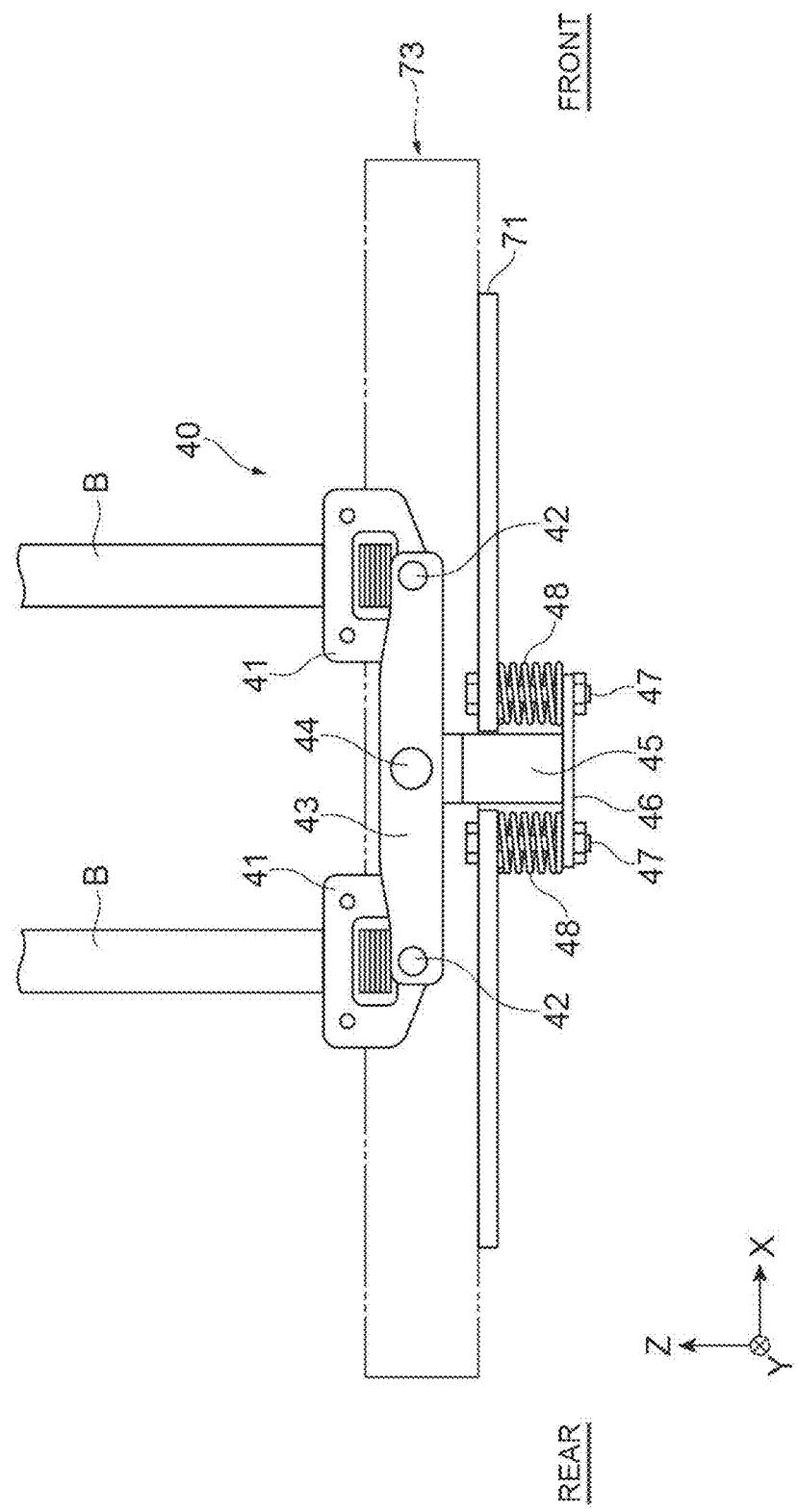
FIG. 4 is a side view of a second buffering mechanism.

One end of a belt B is connected to the holding unit 7 according to the present embodiment via a first buffering mechanism 50 (refer to FIG. 3) and a second buffering mechanism 40 (refer to FIG. 4). The following describes the first buffering mechanism 50 and the second buffering mechanism 40 in detail. FIG. 3 is a side view of the first buffering mechanism 50, and FIG. 4 is a side view of the second buffering mechanism 40. For convenience of explanation, FIG. 3 does not illustrate part of a first body member 54 (a second support member 54B) and a link mechanism 80 coupled to the first buffering mechanism 50 (described later). Additionally, for convenience of explanation, FIG. 4 does not illustrate part of a fourth body member 46 (a fourth support member 46B) and the link mechanism 80 coupled to the second buffering mechanism 40 (described later). As illustrated in FIG. 3 and FIG. 4, each of the first buffering mechanism 50 and the second buffering mechanism 40 is a mechanism configured to couple the belt B to the holding unit 7 (refer to FIG. 1), and is a mechanism configured to prevent vibration from being transmitted to the FOUP 200, the vibration caused when the traveling unit 3 travels or the holding unit 7 is lifted or lowered.

As illustrated in FIG. 2, the first buffering mechanism 50 is provided on a left side of the holding unit 7 in a right and left direction. As illustrated in FIG. 3, the first buffering mechanisms 50 are disposed at two points along a front and rear direction. The first buffering mechanism 50 includes a connection member 51, a swing member 53, the first body member 54, a second body member 56, first shaft parts 57, 57, and first spring members 58, 58.

The connection member 51 is a member attached to the belt B. The swing member 53 is a member coupled to the connection member 51. The swing member 53 is coupled to the connection member 51 in a rotatable manner via a first pin member 52. The first body member 54 is a substantially U-shaped member the upper end of which is opened, and a bottom part thereof is formed to be flat in the horizontal direction. Upper ends of the first body member 54 are coupled to both ends of the swing member 53 by a bolt 55. The first body member 54 includes the first support member 54A (refer to FIG. 5) and the second support member 54B (refer to FIG. 5). The first support member 54A supports the first spring members 58, 58 from a lower side. The second support member 54B is a member orthogonal to the first support member 54A.

The second body member 56 is a member configured to couple substantially center parts of the swing member 53 and the first body member 54 in the front and rear direction to each other. The pair of first shaft parts 57, 57 is bar-shaped members extending upward from the first body member 54, and disposed across the second body member 56 in the front and rear direction. The pair of first spring members 58, 58 is compression coil springs each having a predetermined spring constant, and respectively inserted into the pair of first shaft parts 57, 57. The base 71 is disposed on upper ends of the pair of first spring members 58, 58 in a contact state. The first spring member 58 presses the base 71 in an upward direction opposite to a gripping direction for the FOUP 200 (downward in a vertical direction). The first spring member 58 as a vibration-proof part has a role of reducing vibration transmitted between members being in contact with each other.

As illustrated in FIG. 2, the second buffering mechanism 40 is provided on a right side of the holding unit 7 in the right and left direction. As illustrated in FIG. 4, the second buffering mechanism 40 is disposed in the vicinity of a center part in the front and rear direction. The second buffering mechanism 40 includes connection members 41, 41, an swing member (swing part) 43, a third body member 45, the fourth body member 46, second shaft parts 47, 47, and second spring members 48, 48.

The connection members 41, 41 are members to which belts B, B are respectively attached. The swing member 43 is a member configured to couple the pair of connection members 41, 41 to the third body member 45. The pair of connection members 41, 41 and the swing member 43 are coupled to each other in a bidirectionally rotatable manner via a pair of third pin members 42, 42. The swing member 43 and the third body member 45 are coupled to each other via a fourth pin member 44. The fourth body member 46 is a plate material that is coupled to a lower end of the third body member 45, and extends in the horizontal direction. The fourth body member 46 includes a third support member 46A (refer to FIG. 5) and the fourth support member 46B (refer to FIG. 5). The third support member 46A supports the second spring members 48, 48 from the lower side. The fourth support member 46B is a member orthogonal to the third support member 46A.

The pair of second shaft parts 47, 47 is bar-shaped members extending upward from the fourth body member 46, and disposed across the third body member 45 in the front and rear direction. The pair of second spring members 48, 48 is compression coil springs each having a predetermined spring constant, and respectively inserted into the pair of second shaft parts 47, 47. The base 71 is disposed on upper ends of the pair of second shaft parts 47, 47 in a contact state. The second spring member 48 presses the base 71 in an upward direction opposite to the gripping direction for the FOUP 200 (downward in the vertical direction). The second spring member 48 as a vibration-proof part has a role of reducing vibration transmitted between members being in contact with each other.

Figure 5:
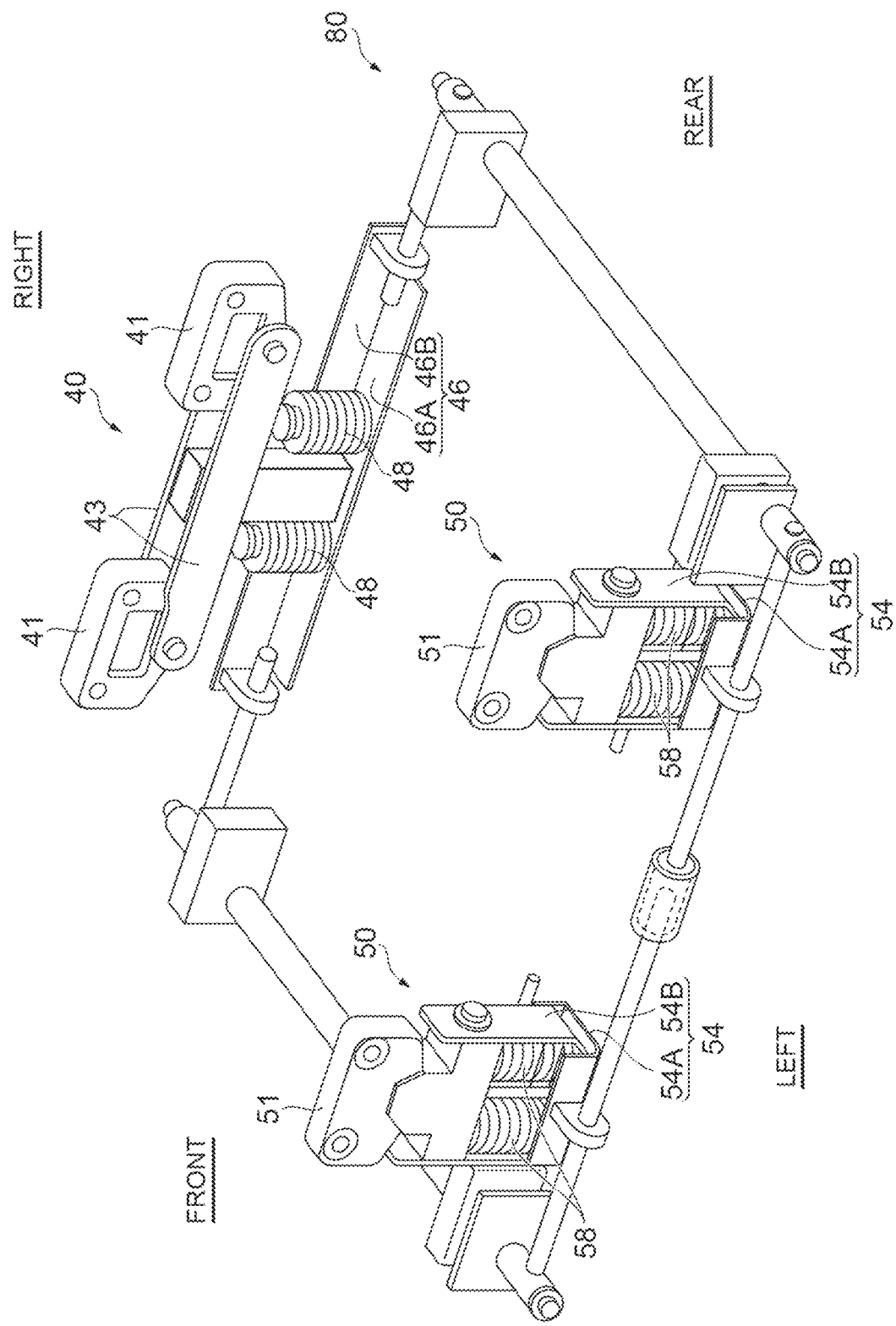
FIG. 5 is a perspective view of a link mechanism.

As illustrated in FIG. 5, the link mechanism 80 couples the two first buffering mechanisms 50 and the second buffering mechanism 40 arranged in the right and left direction (width direction) orthogonal to both of the front and rear direction (traveling direction) and an upper and lower direction (vertical direction), and also couples the two first buffering mechanisms 50, 50 arranged in the front and rear direction. The link mechanism 80 operates to bring a distance between the first body member 54 of the first buffering mechanism 50 and the base 71 to be closer to a distance between the fourth body member 46 of the second buffering mechanism 40 and the base 71. The link mechanism 80 also operates to bring a distance between the first body member 54 of the first buffering mechanism 50 disposed on the left side and the base 71 to be closer to a distance between the first body member 54 of the first buffering mechanism 50 disposed on the right side and the base 71. That is, the link mechanism 80 functions as a stabilizer for the overhead transport vehicle 1.

Figure 6:
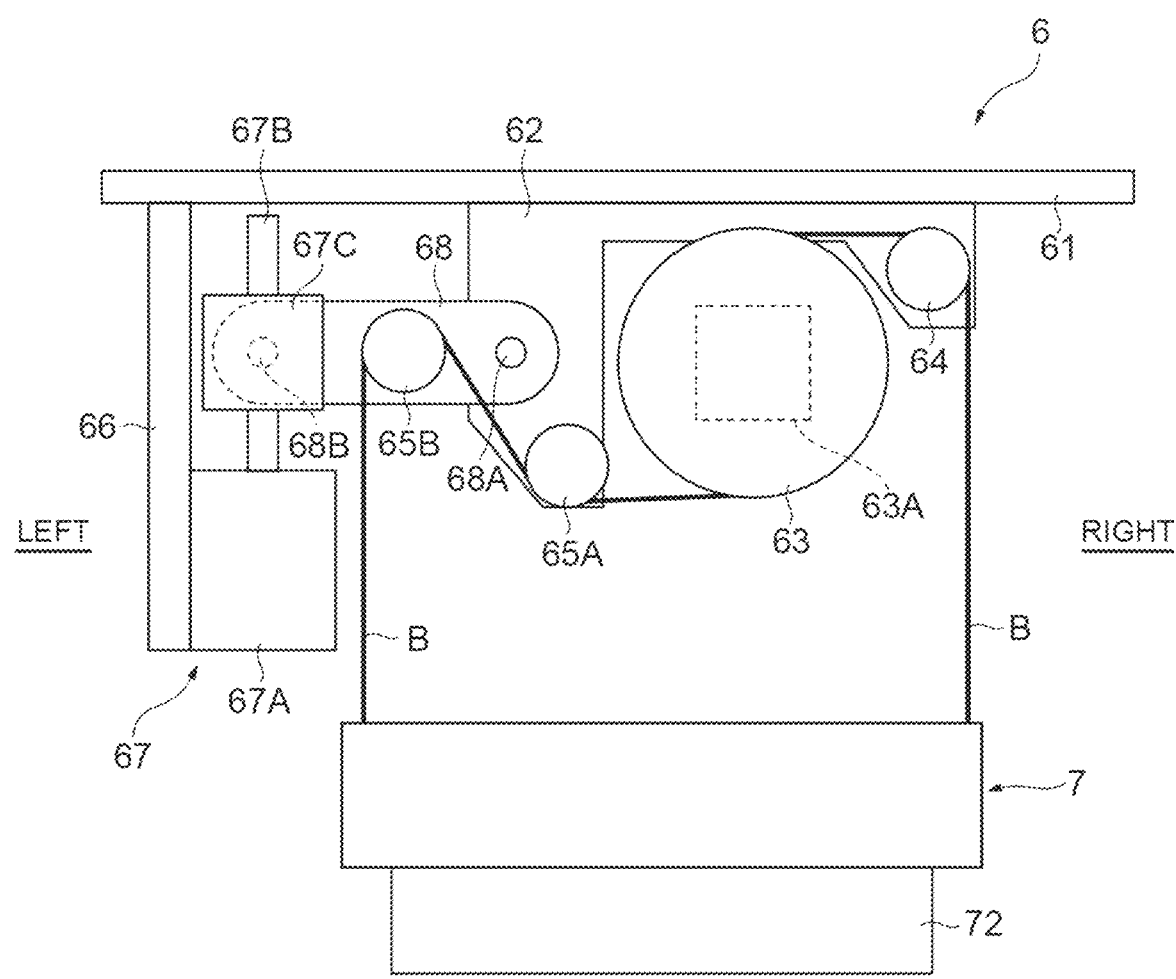
FIG. 6 is a front view of a lifting drive unit.

Next, the following describes a configuration of the lifting drive unit 6 in detail. As illustrated in FIG. 6 and FIG. 7, the lifting drive unit 6 includes a base (body frame) 61, a supporting part 62, four (a plurality of) winding drums 63, a driving motor (winding drive unit) 63A, a first idler roller 65A, a second idler roller (guide roller) 65B, a third idler roller 64, a linear motion mechanism (actuator) 67, an swing member 68, and four (a plurality of) belts (suspending members) B.

The base 61 is provided on the traveling unit. The base 61 supports the winding drum 63 and the first idler roller 65A via the supporting part 62. The supporting part 62 supports the four winding drums 63 in a rotatable manner. The four winding drums 63 are arranged in the front and rear direction, and winds or pays out (e.g., unwinds) each of the four belts B by being driven by the driving motor 63A. FIG. 7, FIG. 9(A), and FIG. 9(B) does not illustrate the winding drum 63 by which the belt B connected to the second buffering mechanism 40 is wound. The supporting part 62 supports the first idler roller 65A and one end part 68A of the swing member 68 in a swingable manner.

Each of the winding drums 63 is attached to the base 61 via the supporting part 62 in a rotatable manner. The driving motor 63A is a driving source for rotating each of the winding drums 63, and fixed to the base 61. The four winding drums 63 are driven by the one driving motor 63A by being attached to a common rotating shaft (not illustrated), or by being coupled to each other via an interlocking mechanism (not illustrated).

One end of each belt B is connected to the holding unit 7, and the other end of each belt B is connected to each winding drum 63. In the present embodiment, the four belts B are configured to suspend three points of the holding unit 7. More specifically, the holding unit 7 is suspended by the four belts B. Two of the four belts B are connected to the one swing member 43 (refer to FIG. 4) that is provided in a swingable manner with respect to the holding unit 7 via the connection members 41, and the remaining two of the four belts are respectively connected to swing members 53 that are provided in a swingable manner with respect to the holding unit 7 via connection members 51.

The first idler roller 65A and the second idler roller 65B guide movement of the belt B connected to the first buffering mechanism 50. The two belts B are connected to the first buffering mechanism 50, and the first idler roller 65A and the second idler roller 65B are provided corresponding to each of the belts B. The first idler roller 65A is provided on the supporting part 62, and does not move relatively to the base 61. The second idler roller 65B is provided on the swing member 68 (described later), and moves relatively to the base 61. The configuration in which the second idler roller 65B moves relatively to the base 61 will be described at a later stage. The third idler roller 64 guides movement of the belt B connected to the second buffering mechanism 40. The two belts B are connected to the second buffering mechanism 40, and the third idler roller 64 is provided corresponding to each of the belts B.

The linear motion mechanism 67 is a known mechanism mainly including a driving motor 67A, a screw shaft 67B, and a ball nut 67C, and configured to convert a rotational motion of the driving motor 67A into a linear motion. The linear motion mechanism 67 is fixed to the base 61 via a bracket 66. Another end part 68B of the swing member 68 is connected to the ball nut 67C in a swingable manner, the ball nut 67C configured to move along the screw shaft 67B by being driven by the driving motor 67A. In the present embodiment, the swing member 68 swings when the ball nut 67C moves along the screw shaft 67B, and the second idler roller 65B moves relatively to the base 61 along with the swing of the swing member 68. In this way, the linear motion mechanism 67 moves the position of the second idler roller 65B so that a connecting portion of the belt B (one end of the belt B) to the holding unit 7 (first buffering mechanism 50) moves in the lifting direction.

For example, as illustrated in FIG. 8(A), when both linear motion mechanisms 67 are caused to operate and second idler rollers 65B are moved upward (to be closer to the base 61), the left side of the holding unit 7 can be inclined upward. For example, as illustrated in FIG. 8(B), when both linear motion mechanisms 67 are caused to operate and the second idler rollers 65B are moved downward (to be moved away from the base 61), the left side of the holding unit 7 can be inclined downward.

For example, as illustrated in FIG. 9(A), when one linear motion mechanism 67 (on the front side) of the two linear motion mechanisms 67 is caused to operate and the second idler roller 65B is moved upward (to be closer to the base 61), the front side of the holding unit 7 can be inclined upward. In a case in which the front side of the holding unit 7 is desired to be inclined upward, the other linear motion mechanism 67 (on the rear side) of the two linear motion mechanisms 67 may be caused to operate, and the second idler roller 65B may be moved downward (to be moved away from the base 61).

For example, as illustrated in FIG. 9(B), when the other linear motion mechanism 67 (on the rear side) of the two linear motion mechanisms 67 is caused to operate and the second idler roller 65B is moved upward (to be closer to the base 61), the rear side of the holding unit 7 can be inclined upward. In a case in which the rear side of the holding unit 7 is desired to be inclined upward, one linear motion mechanism 67 (on the front side) of the two linear motion mechanisms 67 may be caused to operate, and the second idler roller 65B may be moved downward (to be moved away from the base 61).

Figure 10:
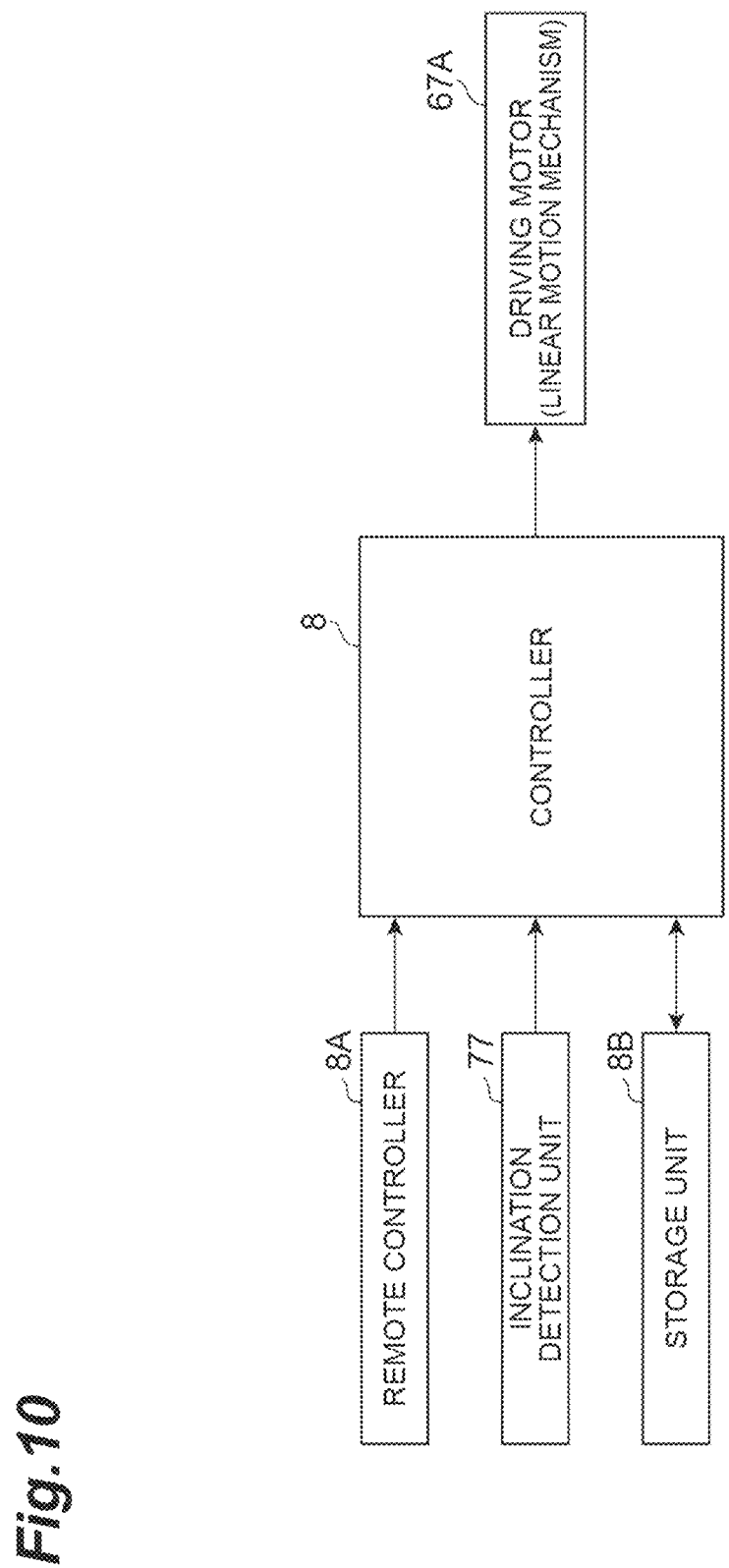
FIG. 10 is a block diagram illustrating a functional configuration of the overhead transport vehicle in FIG. 1.

In the present embodiment, by causing both or one of the two linear motion mechanisms 67 to operate, the inclination of the holding unit 7 with respect to the horizontal plane can be adjusted. With this configuration, as illustrated in FIG. 10, the linear motion mechanism 67 can be operated via the controller 8 by means for operation such as a remote controller 8A. The controller 8 may be connected to the remote controller 8A in a wired or wireless manner. The linear motion mechanism 67 can also be operated via the controller 8 by an area controller (not illustrated) and the like configured to integrally control the overhead transport vehicle 1 via a high-frequency current line installed along the track 100.

In the present embodiment, it is possible to suppress the inclination of the holding unit 7 due to variations in a winding amount per rotation of the winding drum 63 that increases as the winding amount increases. For example, the inclination of the holding unit 7 corresponding to the winding amount is stored in the storage unit 8B in advance, for example, and the controller 8 controls the linear motion mechanism 67 (driving motor 67A) based on information on the inclination of the holding unit 7 read out from the storage unit 8B. More specifically, in a case in which the holding unit 7 is desired to be maintained in the horizontal state, the inclination of the holding unit 7 corresponding to the winding amount is acquired from the storage unit 8B, and the linear motion mechanism 67 is caused to operate in a direction for canceling the acquired inclination. Also in a case in which the inclination of the holding unit 7 is desired to match an inclination of the load port 300, the inclination of the holding unit 7 corresponding to the winding amount is acquired from the storage unit 8B, and the linear motion mechanism 67 is caused to operate to cause the acquired inclination to be a predetermined inclination. The storage unit 8B may be provided on the overhead transport vehicle 1, or may be provided at a place distant from the overhead transport vehicle 1 in a communicable manner.

The controller 8 may control the linear motion mechanism 67 based on a distortion amount of the lateral unit 4 at the time when the lateral unit 4 advances. Specifically, for example, the storage unit 8B may be provided, the distortion amount described above per weight of the FOUP 200 may be stored in the storage unit 8B, and the controller (first control unit) 8 may control the linear motion mechanism 67 so that the holding unit 7 becomes horizontal or the inclination thereof becomes the same as the inclination of the load port 300 in accordance with the distortion amount at the time when the lateral unit 4 sends out the FOUP 200 in the horizontal direction.

In accordance with the inclination of the load port 300, the controller 8 may control the linear motion mechanism 67 so that the inclination of the holding unit 7 becomes substantially the same as the inclination of the load port 300. Specifically, the inclination of each load port 300 may be stored in the storage unit 8B in advance, and the controller (second control unit) 8 may acquire, from the storage unit 8B, the inclination of the load port 300 on which the FOUP 200 is going to be placed at the time of placing the FOUP 200, and control the linear motion mechanism 67 so that the inclination of the holding unit 7 becomes substantially the same as the inclination of the load port.

An inclination detection unit 77 configured to acquire the inclination of the holding unit 7 with respect to the horizontal direction may be provided on the holding unit 7, for example. Examples of the inclination detection unit 77 include a triaxial sensor and an acceleration sensor. The controller (third control unit) 8 may control the linear motion mechanism 67 so that the inclination acquired by the inclination detection unit 77 becomes a predetermined value (for example, the horizontal state or the inclination of the load port 300). Also in this case, information on the inclination of the load port 300 may be stored in the storage unit 8B and the like in advance.

The following describes a working effect of the overhead transport vehicle 1 according to the embodiment described above. In the overhead transport vehicle 1 according to the embodiment described above, one end of the belt B (the connecting portion to the holding unit 7) moves when the linear motion mechanism 67 is caused to operate. Thus, by performing simple work of causing the linear motion mechanism 67 to operate, the connecting portion can be moved upward or moved downward. That is, part of or the entire holding unit 7 can be moved in the upper and lower direction following movement of one end of the belt B. Due to this, the inclination of the holding unit 7 can be easily adjusted.

In the overhead transport vehicle 1 according to the embodiment described above, the belts B are configured to suspend three points of the holding unit 7, and the linear motion mechanism 67 moves positions of the second idler rollers 65B around which the belts B for suspending two of the three points are wound. Due to this, the holding unit 7 can be suspended in a stable state. By moving the second idler roller 65B around which the holding belts B for suspending two points is wound, the holding unit 7 can be caused to be in a desired inclination state.

In the overhead transport vehicle 1 according to the embodiment described above, the holding unit 7 is suspended by the four belts B. Two of the four belts B are connected to the one swing member 43 that is provided in a swingable manner with respect to the holding unit 7 via the connection members 41, and the remaining two of the four belts B are respectively connected to the swing members 53 that are provided in a swingable manner with respect to the holding unit 7 via the connection members 51. Due to this, even in a case in which the holding unit 7 is suspended by the four belts B, the holding unit 7 can be suspended at three points by the two belts B and the swing member 43. Due to this, it is possible to reduce the possibility that the holding unit 7 falls when the belt B is cut, and the holding unit 7 can be suspended in a stable state.

In the overhead transport vehicle 1 according to the embodiment described above, the linear motion mechanism 67 is controlled so that the inclination of the holding unit 7 becomes, for example, the horizontal state, or substantially the same state as the inclination of the transfer part based on the distortion amount of the lateral unit 4 at the time when the lateral unit 4 advances in the horizontal direction. As a result, the FOUP 200 can be stably delivered from the holding unit 7 to the load port 300. Conventional overhead transport vehicles do not have such means for adjusting the inclination state of the holding unit, so that the inclination of the load port 300 has been adjusted to match the inclination of the holding unit. In the present embodiment, such adjustment for the load port 300 is not required.

In the overhead transport vehicle 1 according to the embodiment described above, the linear motion mechanism 67 is controlled so that the inclination acquired by the inclination detection unit 77 becomes the predetermined value, so that the holding unit 7 can be caused to be in a desired inclination state (including the horizontal state) at all times, or the inclination state of the holding unit 7 can be caused to match the inclination of the load port 300.

The overhead transport vehicle 1 according to the embodiment described above includes the storage unit 8B configured to previously store the inclination of each load port 300 which delivers/receives the FOUP 200 to/from the overhead transport vehicle 1. Due to this, at the time of delivering the FOUP 200 from the holding unit 7 to the load port 300, the inclination of the holding unit 7 can be caused to match the inclination of the load port 300. As a result, the FOUP 200 can be stably delivered from the holding unit 7 to the load port 300.

The embodiment has been described above, but one aspect of the present invention is not limited to the embodiment described above. Various modifications can be made without departing from the gist of one aspect of the invention.

First Modification

In the overhead transport vehicle 1 according to the embodiment described above, in place of the linear motion mechanism 67 having the function of moving the position of at least one second idler roller 65B for moving one end of the belt B in the lifting direction, a cam mechanism (actuator) 167 having a similar function may be provided.

Figure 11:
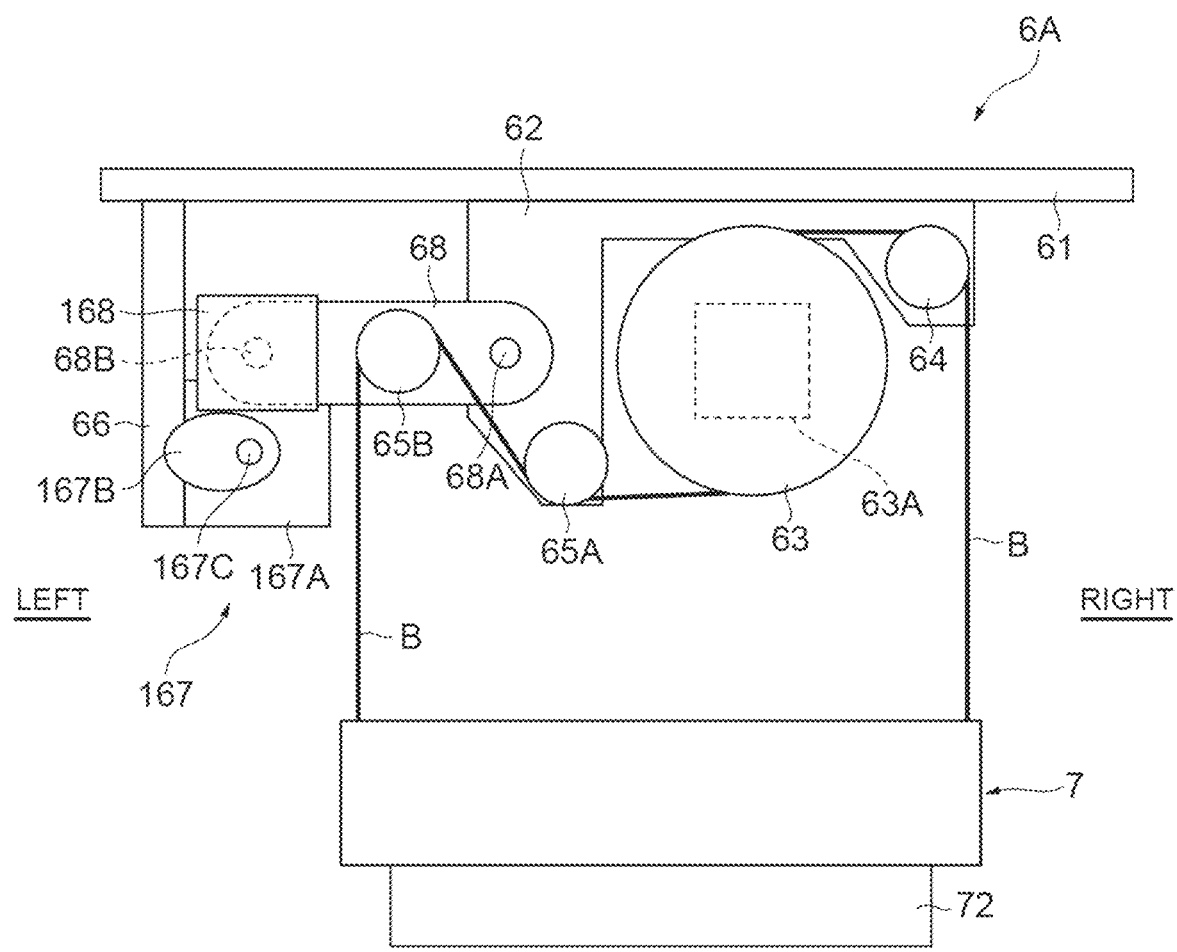
FIG. 11 is a front view of a lifting drive unit according to a first modification.

As illustrated in FIG. 11, the cam mechanism 167 is a known mechanism mainly including a driving motor 167A, a cam member 167B, a rotating shaft 167C, and a receiving member 168, and configured to convert a motion direction of a rotational motion of the driving motor 167A. The cam mechanism 167 is fixed to the base 61 via the bracket 66. The cam member 167B having an elliptical shape is attached to the rotating shaft 167C of the driving motor 167A. The receiving member 168 having a rectangular shape is fixed to the other end part 68B of the swing member 68. The receiving member 168 is configured to be in contact with an outer peripheral surface of the cam member 167B.

In the cam mechanism 167, the cam member 167B rotates along with rotation of the rotating shaft 167C. The cam member 167B is formed in an elliptical shape, so that a contact portion between the cam member 167B and the receiving member 168 moves in the lifting direction along with the rotation of the cam member 167B, and thereby the other end part 68B of the swing member 68 swings. That is, the swing member 68 swings when the cam member 167B is rotated, and the second idler roller 65B moves relatively to the base 61 along with the swing of the swing member 68. In this way, the cam mechanism 167 moves the position of the second idler roller 65B so that the connecting portion of the belt B (one end of the belt B) to the holding unit 7 (first buffering mechanism 50) moves in the lifting direction.

For example, as illustrated in FIG. 12(A), when both cam mechanisms 167 are caused to operate and the second idler rollers 65B are moved upward (to be closer to the base 61), the left side of the holding unit 7 can be inclined upward. For example, as illustrated in FIG. 12(B), when both cam mechanisms 167 are caused to operate and the second idler rollers 65B are moved downward (to be moved away from the base 61), the left side of the holding unit 7 can be inclined downward.

Although not illustrated, when one cam mechanism 167 (on the front side) of the two cam mechanisms 167 is caused to operate and the second idler roller 65B is moved upward (to be closer to the base 61), the front side of the holding unit 7 can be inclined upward. In a case in which the front side of the holding unit 7 is desired to be inclined, the other cam mechanism 167 (on the rear side) of the two cam mechanisms 167 may be caused to operate, and the second idler roller 65B may be moved downward (to be moved away from the base 61). Similarly, when the other cam mechanism 167 (on the rear side) of the two cam mechanisms 167 is caused to operate and the second idler roller 65B is moved upward (to be closer to the base 61), the rear side of the holding unit 7 can be inclined upward. In a case in which the rear side of the holding unit 7 is desired to be inclined upward, one cam mechanism 167 (on the front side) of the two cam mechanisms 167 may be caused to operate, and the second idler roller 65B may be moved downward (to be moved away from the base 61).

With such a configuration according to the first modification, one end of the belt B moves when the cam mechanism 167 is caused to operate. Due to this, the inclination of the holding unit 7 can be easily adjusted.

Second Modification

The overhead transport vehicle 1 according to the embodiment has been described above using the example of moving one end of the belt B in the lifting direction by moving the position of the at least one second idler roller 65B. Alternatively, one end of the belt B may be moved in the lifting direction by moving the position of the first idler roller 65A in place of the second idler roller 65B.

Figure 13:
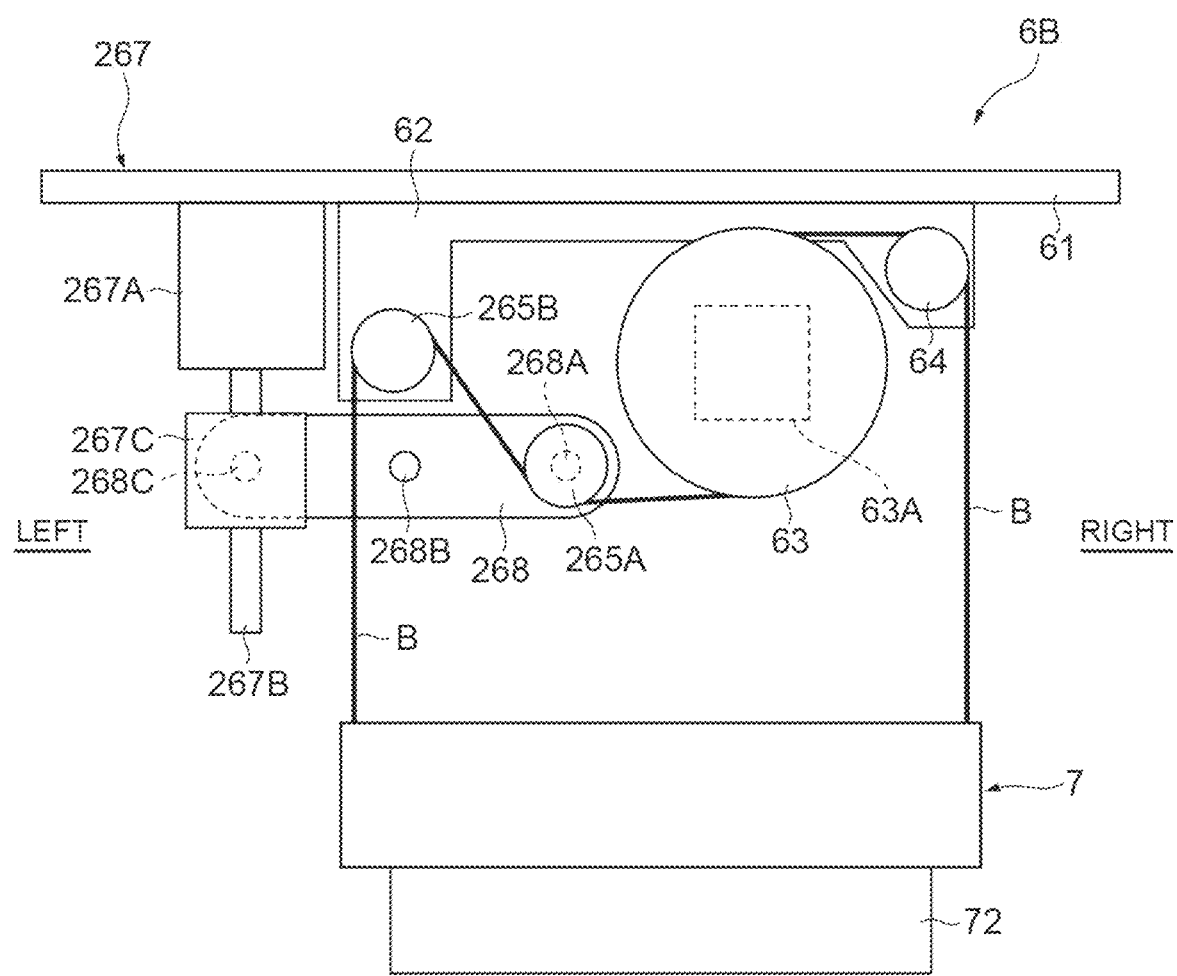
FIG. 13 is a front view of a lifting drive unit according to a second modification.

Specific description will be made with reference to FIG. 13. A second idler roller 265B is attached to the base 61 via the supporting part 62. The second idler roller 265B does not move relatively to the base 61. A first idler roller 265A is provided on one end part 268A of a swing member 268. The swing member 268 is configured to be rotatable about a center part 268B as a rotating shaft. Another end 268C of the swing member 268 is fixed to a ball nut 267C constituting a linear motion mechanism (actuator) 267 in a rotatable manner. The linear motion mechanism 267 has a configuration similar to that of the linear motion mechanism 67 according to the embodiment described above, and includes a driving motor 267A, a screw shaft 267B, and the ball nut 267C. The driving motor 267A is fixed to the base 61.

In the present embodiment, the swing member 268 swings when the ball nut 267C moves along the screw shaft 267B, and the first idler roller 265A moves relatively to the base 61 along with the swing of the swing member 268. In this way, the linear motion mechanism 267 moves the position of the first idler roller 265A so that the connecting portion of the belt B to the holding unit 7 (first buffering mechanism 50) moves in the lifting direction.

For example, as illustrated in FIG. 14(A), when both linear motion mechanisms 267 are caused to operate and first idler rollers 265A are moved upward (to be closer to the base 61), the left side of the holding unit 7 can be inclined downward. For example, as illustrated in FIG. 14(B), when both linear motion mechanisms 267 are caused to operate and the first idler rollers 265A are moved downward (to be moved away from the base 61), the left side of the holding unit 7 can be inclined upward.

Although not illustrated, when one linear motion mechanism 267 (on the front side) of the two linear motion mechanisms 267 is caused to operate and the first idler roller 265A is moved upward (to be closer to the base 61), the front side of the holding unit 7 can be inclined downward. In a case in which the front side of the holding unit 7 is desired to be inclined downward, the other linear motion mechanism 267 (on the rear side) of the two linear motion mechanisms 267 may be caused to operate, and the first idler roller 265A may be moved downward (to be moved away from the base 61). When the other linear motion mechanism 267 (on the rear side) of the two linear motion mechanisms 267 is caused to operate and the first idler roller 265A is moved downward (to be moved away from the base 61), the rear side of the holding unit 7 can be inclined upward. In a case in which the rear side of the holding unit 7 is desired to be inclined upward, one linear motion mechanism 267 (on the front side) of the two linear motion mechanisms 267 may be caused to operate, and the first idler roller 265A may be moved upward (to be closer to the base 61).

With such a configuration according to the second modification, one end of the belt B moves when the linear motion mechanism 267 is caused to operate. Due to this, the inclination of the holding unit 7 can be easily adjusted. Additionally, with the configuration according to the second modification in which the second idler roller 65B is not moved, position variations of the second idler roller 65B with respect to the connecting portion of the belt B to the holding unit 7 can be reduced in a plan view viewed from an upper side in the lifting direction, so that the holding unit 7 can be stably suspended.

The first idler roller 65A included in the embodiment and the first modification described above is not necessarily disposed. That is, the belt B paid out from the winding drum 63 may be directly wound around the second idler roller 65B. The first idler roller 65A is provided for causing a length of the belt B from the winding drum 63 to the holding unit 7 via the first idler roller 65A and the second idler roller 65B to match the length of the belt B from the winding drum 63 to the third idler roller 64. By providing the first idler roller 65A, it is possible to suppress variations caused by thickening of winding at the time of winding or paying out. That is, an adjustment amount by the linear motion mechanism 67 or the cam mechanism 167 can be reduced.

The embodiment and the second modification describe the example of employing the ball screw as the linear motion mechanisms 67, 267, but a cylinder, a linear guide, and the like may be employed.

In the embodiment, the first modification, and the second modification described above, the holding unit 7 is connected to one end of the belt B via the first buffering mechanism 50 and the second buffering mechanism 40 by way of example, but may be directly connected to the holding unit 7. The four belts B may be directly connected to the holding unit 7. Alternatively, the three belts B may be connected to the holding unit 7.

In the embodiment, the first modification, and the second modification described above, the inclination detection unit 77 is provided in the holding unit 7 by way of example. With this configuration, operation may be performed with the remote controller 8A so that the inclination detected by the inclination detection unit 77 for each pay-out amount of the belt B becomes horizontal, and a value obtained by this operation with the remote controller may be acquired as a correction value (a control value for the linear motion mechanisms 67, 267, or the cam mechanism 167). The correction value may be stored in the storage unit 8B. By causing the gripper 72 to grip a jig having a function of detecting an inclination, a correction value similar to the correction value obtained from the inclination detection unit 77 may be acquired.

SEQUENCE LISTING

1 OVERHEAD TRANSPORT VEHICLE
3 TRAVELING UNIT (TRAVELING PART)
4 LATERAL UNIT (HORIZONTAL MOVEMENT PART)
6 LIFTING DRIVE UNIT
7 HOLDING UNIT (LIFTING UNIT)
8 CONTROLLER (FIRST CONTROL UNIT, SECOND CONTROL UNIT, THIRD CONTROL UNIT)
8B STORAGE UNIT
43 SWING MEMBER (SWING PART)
61 BASE (BODY FRAME)
63 WINDING DRUM
63A DRIVING MOTOR (WINDING DRIVE UNIT)
64 THIRD IDLER ROLLER
65A FIRST IDLER ROLLER
65B SECOND IDLER ROLLER (GUIDE ROLLER)
67 LINEAR MOTION MECHANISM (ACTUATOR)
72 GRIPPER (GRIPPING PART)
77 INCLINATION DETECTION UNIT
80 LINK MECHANISM
100 TRACK
167 CAM MECHANISM (ACTUATOR)
265A FIRST IDLER ROLLER (GUIDE ROLLER)
265B SECOND IDLER ROLLER
267 LINEAR MOTION MECHANISM (ACTUATOR)
300 LOAD PORT (TRANSFER PART)
B BELT (SUSPENDING MEMBER)

The invention claimed is:

1. An overhead transport vehicle configured to cause a lifting unit including a gripping part configured to grasp an article to be lifted and lowered, by a plurality of suspending members, with respect to a traveling part configured to travel along a track, the overhead transport vehicle comprising:
 a winding drum configured to be driven by a winding drive unit, and to cause the lifting unit to be lifted and lowered by winding and unwinding the suspending members;
 at least one guide roller around which at least one of the suspending members is wound;
 a body frame provided on the traveling part, and configured to support the winding drum and the at least one guide roller;
 an actuator configured to move a position of the at least one guide roller so that a connecting portion of the at least one of the suspending members to the lifting unit moves in a lifting direction;
 a storage unit configured to store an inclination of each transfer part which delivers or receives the article to or from the overhead transport vehicle; and
 a third control unit configured to control the actuator so that an inclination of the lifting unit becomes substantially the same as the inclination of the transfer part on which the article is going to be placed.

2. The overhead transport vehicle according to claim 1, further comprising:
 a horizontal movement part configured to cause the lifting unit to move in a horizontal direction; and
 a first control unit configured to control a movement amount of the at least one guide roller moved by the actuator based on a distortion amount of the horizontal movement part at the time when the lifting unit is moved by the horizontal movement part.

3. The overhead transport vehicle according to claim 1, further comprising:
 an inclination detection unit configured to acquire an inclination of the lifting unit with respect to a horizontal direction; and
 a second control unit configured to control the actuator so that the inclination acquired by the inclination detection unit becomes a predetermined value.

4. The overhead transport vehicle according to claim 2, further comprising:
 an inclination detection unit configured to acquire an inclination of the lifting unit with respect to the horizontal direction; and
 a second control unit configured to control the actuator so that the inclination acquired by the inclination detection unit becomes a predetermined value.

* * * * *